United States Patent
Goda et al.

(10) Patent No.: US 10,847,233 B2
(45) Date of Patent: *Nov. 24, 2020

(54) MEMORY DEVICES AND APPARATUS CONFIGURED TO APPLY POSITIVE VOLTAGE LEVELS TO DATA LINES FOR MEMORY CELLS SELECTED FOR AND INHIBITED FROM PROGRAMMING

(71) Applicant: MICRON TECHNOLOGY, INC., Boise, ID (US)

(72) Inventors: Akira Goda, Boise, ID (US); Yijie Zhao, Boise, ID (US); Krishna Parat, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/435,996

(22) Filed: Jun. 10, 2019

(65) Prior Publication Data

US 2019/0295668 A1    Sep. 26, 2019

Related U.S. Application Data

(60) Continuation of application No. 16/035,857, filed on Jul. 16, 2018, now Pat. No. 10,438,672, which is a
(Continued)

(51) Int. Cl.
*G11C 16/34*    (2006.01)
*G11C 16/04*    (2006.01)
*G11C 16/10*    (2006.01)

(52) U.S. Cl.
CPC ...... *G11C 16/3427* (2013.01); *G11C 16/0483* (2013.01); *G11C 16/10* (2013.01); *G11C 16/3418* (2013.01)

(58) Field of Classification Search
CPC . G11C 16/3427; G11C 16/10; G11C 16/0483; G11C 16/3418
See application file for complete search history.

(56) References Cited

U.S. PATENT DOCUMENTS

| 5,812,454 A | 9/1998 | Choi |
| 6,175,522 B1 * | 1/2001 | Fang ................. G11C 16/0483 |
| | | 365/185.17 |

(Continued)

OTHER PUBLICATIONS

Ishiduki et al.; "Optimal Device Structure for Pipe-shaped BiCS Flash Memory for Ultra High Density Storage Device with Excellent Performance and Reliability," IEEE IEDM09-625, pp. 27.3.1-27.3.4, 2009.

*Primary Examiner* — Khamdan N. Alrobaie
(74) *Attorney, Agent, or Firm* — Dicke, Billig & Czaja, PLLC

(57) ABSTRACT

Memory devices including a controller configured to cause the memory device to apply a positive first voltage level to a first data line selectively connected to a first string of series-connected memory cells while applying a second voltage level, higher than the first voltage level, to a second data line selectively connected to a second string of series-connected memory cells; while applying the first voltage level to the first data line and applying the second voltage level to the second data line, applying a third voltage level to a particular access line coupled to a memory cell of a first string of series-connected memory cells selected for programming, wherein a differential between the third voltage level and the first voltage level is configured to increase a threshold voltage of the memory cell selected for programming, as well as other apparatus containing similar memory devices.

20 Claims, 11 Drawing Sheets

Related U.S. Application Data continuation of application No. 15/478,312, filed on Apr. 4, 2017, now Pat. No. 10,049,756, which is a continuation of application No. 14/995,302, filed on Jan. 14, 2016, now Pat. No. 9,646,702, which is a division of application No. 13/438,331, filed on Apr. 3, 2012, now Pat. No. 9,251,907.

(56) References Cited

U.S. PATENT DOCUMENTS

| | | |
|---|---|---|
| 7,023,739 B2 | 4/2006 | Chen et al. |
| 7,692,971 B2 | 4/2010 | Moschiano et al. |
| 7,724,577 B2 * | 5/2010 | Goda .................... G11C 16/10 365/185.11 |
| 8,750,040 B2 | 6/2014 | Goda |
| 10,438,672 B2 * | 10/2019 | Goda .................... G11C 16/10 |
| 2002/0036936 A1 | 3/2002 | Park |
| 2007/0242511 A1 | 10/2007 | Chen et al. |
| 2009/0122606 A1 | 5/2009 | Kim et al. |
| 2010/0054036 A1 | 3/2010 | Lee |
| 2010/0159657 A1 | 6/2010 | Arai et al. |
| 2010/0207190 A1 | 8/2010 | Katsumata et al. |
| 2010/0232224 A1 | 9/2010 | Maeda et al. |
| 2011/0013458 A1 | 1/2011 | Seol |
| 2011/0058424 A1 * | 3/2011 | Goda .................. G11C 11/5628 365/185.19 |
| 2012/0044771 A1 | 2/2012 | Joo |
| 2012/0134215 A1 | 5/2012 | Goda |
| 2014/0063966 A1 | 3/2014 | Kim |

\* cited by examiner

MEMORY DEVICES AND APPARATUS CONFIGURED TO APPLY POSITIVE VOLTAGE LEVELS TO DATA LINES FOR MEMORY CELLS SELECTED FOR AND INHIBITED FROM PROGRAMMING

RELATED APPLICATIONS

This application is a continuation of application Ser. No. 16/035,857, filed on Jul. 16, 2018, and issued as U.S. Pat. No. 10,438,672 on Oct. 8, 2019, which is a continuation of application Ser. No. 15/478,312, filed on Apr. 4, 2017, issued as U.S. Pat. No. 10,049,756 on Aug. 14, 2018, which is a continuation of application Ser. No. 14/995,302, filed Jan. 14, 2016, issued as U.S. Pat. No. 9,646,702 on May 9, 2017, which is a divisional of application Ser. No. 13/438,331, filed Apr. 3, 2012 and issued as U.S. Pat. No. 9,251,907 on Feb. 2, 2016, which are commonly assigned and incorporated herein by reference.

TECHNICAL FIELD

The present disclosure relates generally to semiconductor memories and, in particular, in one or more embodiments, the present disclosure relates to memory devices and biasing methods for memory devices.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its stored data for some extended period without the application of power. Common uses for flash memory and other non-volatile memory include personal computers, personal digital assistants (PDAs), digital cameras, digital media players, digital recorders, games, appliances, vehicles, wireless devices, mobile telephones and removable memory modules, and the uses for non-volatile memory continue to expand.

Flash memory typically utilizes one of two basic architectures known as NOR Flash and NAND Flash. For example, a NAND flash memory device is a common type of flash memory device, so called for the logical form in which the basic memory cell configuration is arranged and accessed. Typically, the array of memory cells for NAND flash memory devices is arranged such that memory cells are coupled together in series (e.g., coupled source to drain) to form strings of memory cells. Changes in threshold voltage of the memory cells, through programming (which is sometimes referred to as writing) of charge storage structures (e.g., floating gates or charge traps) or other physical phenomena (e.g., phase change or polarization), determine the data value of each cell.

To meet the demand for higher capacity memories, designers continue to strive for increasing memory density, i.e., the number of memory cells for a given area of an integrated circuit die. One way to increase memory density is to reduce the feature size of individual memory cells. Another method has been used to form NAND strings vertically along semiconductor pillars, which act as channel regions of the NAND strings. A number of undesirable effects can occur however when operating memory devices comprising these vertical structures, such as charge leakage and other phenomena which can introduce uncertainty and reduce reliability during various memory device operations, such as programming and/or sensing operations, for example.

For the reasons stated above, and for other reasons stated below which will become apparent to those skilled in the art upon reading and understanding the present specification, there is a need in the art for alternative methods of operating various memory device architectures.

DETAILED DESCRIPTION

Figure 1:
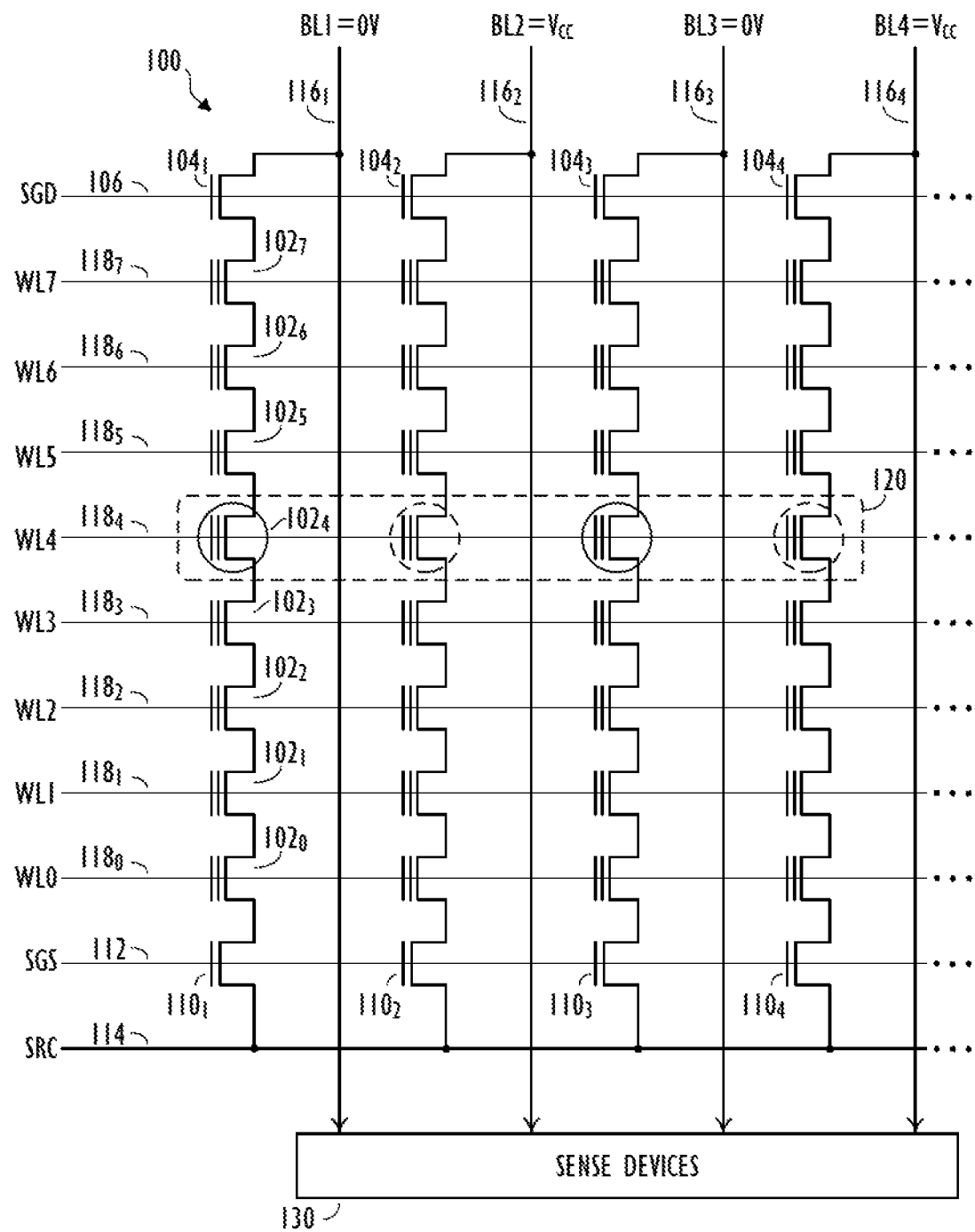
FIG. 1 illustrates a schematic representation of an array of NAND configured memory cells.

In the following detailed description of the invention, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

FIG. 1 illustrates a typical NAND architecture memory array 100 wherein charge storage memory cells 102 of the memory array 100 are logically arranged in an array of rows and columns. In a conventional NAND architecture, "rows" refers to memory cells having commonly coupled control gates, while "columns" refers to memory cells coupled as one or more NAND strings of memory cells 102, for example. The memory cells 102 of the memory array 100 are arranged together in strings (e.g., NAND strings), typically of 8, 16, 32, or more each. Memory cells of a string 102 are connected together in series, source to drain, between a source line 114 and a data line 116, often referred to as a bit line. Each string of memory cells 102 is coupled to source line 114 by a source select gate, such as select gates 110 and to an individual bit line 116 by drain select gates 104, for example. The source select gates 110 are controlled by a source select gate (SGS) control line 112 coupled to their control gates. The drain select gates 104 are controlled by a drain select gate (SGD) control line 106. The one or more strings of memory cells 102 of a memory array 100 are typically arranged in groups (e.g., blocks) of memory cells.

The memory array 100 is accessed by a string driver (not shown) configured to activate a row of memory cells by selecting a particular access line 118, often referred to as a word line, such as WL7-WL0 $118_{7-0}$, for example. Each word line 118 is coupled to the control gates of a row of memory cells 120. Bit lines BL1-BL4 $116_1$-$116_4$ can be biased to a particular potential depending on the type of operation being performed on the array. Bit lines BL1-BL4 116 are coupled to sense devices (e.g., sense amplifiers) 130 that detect the data state of each cell by sensing voltage or current on a particular bit line 116. As is known to those skilled in the art, the number of word lines and bit lines might be much greater than those shown in FIG. 1.

Memory cells 102 may be configured as what are known in the art as Single Level Memory Cells (SLC) or Multilevel Memory Cells (MLC). SLC and MLC memory cells assign a data state (e.g., representing a respective value of one or more bits) to a specific range of threshold voltages (Vt) stored on the memory cells. Single level memory cells (SLC) permit the storage of a single binary digit (e.g., bit) of data on each memory cell. Meanwhile, MLC technology permits the storage of two or more binary digits per cell (e.g., 2, 3, 4, 5 bits), depending on the quantity of Vt ranges assigned to the cell and the stability of the assigned Vt ranges during the lifetime operation of the memory cell. By way of example, one bit (e.g., 1 or 0) may be represented by two Vt ranges, two bits by four ranges, three bits by eight ranges, etc.

Programming typically involves applying one or more programming pulses (Vpgm) to a selected word line 118, such as WL4 $118_4$, and thus to the control gates of the row of memory cells 120 coupled to the selected word line 118. Typical programming pulses (Vpgm) start at or near 15V and tend to increase in magnitude during each programming pulse application. While the program potential (e.g., programming pulse) is applied to the selected word line 118, a potential, such as a ground potential (e.g., 0V), is applied to the substrate, and thus to the channels of these memory cells, resulting in a charge transfer from the channel to the charge storage structures of memory cells targeted for programming. For example, floating gates are typically charged through direct injection or Fowler-Nordheim tunneling of electrons from the channel to the floating gate, resulting in a Vt typically greater than zero in a programmed state. In the example of FIG. 1, a Vpass potential is applied to one or more unselected word lines $118_{7-5}$ and $118_{3-0}$. Vpass might be 10V, for example. The Vpass applied to each unselected word line might be different potentials. A word line adjacent to the selected word line might be biased to a Vpass potential of 8V and the next adjacent word line might be biased to 7V, for example. The Vpass potentials are not high enough to cause programming of memory cells biased to a Vpass potential. One or more additional unselected word lines might be biased to a different potential than a Vpass potential, such as to 0V, for example.

An inhibit potential is typically applied to bit lines 116 (e.g., Vcc) which are not coupled to a NAND string containing a memory cell 102 that is targeted for programming. During a programming operation in a shielded bit line architecture, for example, alternate bit lines 116 may be enabled and inhibited from programming. For example, even numbered bit lines 116 (e.g., $116_2$, and $116_4$) might be enabled for programming of memory cells coupled to even numbered bit lines 116 while the odd numbered bit lines 116 (e.g., $116_1$ and $116_3$) are inhibited from programming memory cells coupled to the odd numbered bit lines 116. A subsequent programming operation might then inhibit the even numbered bit lines 116 and enable the odd numbered bit lines 116. For example, the memory cells 102 of row 120 having solid line circles are selected for programming whereas the memory cells 102 having dashed line circles are inhibited from programming as shown in FIG. 1. However, various embodiments according to the present disclosure are not limited to enabling and/or inhibiting alternate bit lines. Bit lines can be independently enabled or inhibited, such as during a programming operation according to one or more embodiments, for example.

Between the application of one or more programming (e.g., Vpgm) pulses, a verify operation is typically performed to check each selected memory cell to determine if it has reached its intended programmed state. If a selected memory cell has reached its intended programmed state it is inhibited from further programming if there remain other memory cells of the selected row still requiring additional programming pulses to reach their intended programmed states. Following a verify operation, an additional programming pulse Vpgm is applied if there are memory cells that have not completed programming. This process of applying a programming pulse followed by performing a verify operation typically continues until all the selected memory cells have reached their intended programmed states. If a particular number of programming pulses (e.g., maximum number) have been applied and one or more selected memory cells still have not completed programming, those memory cells might be marked as defective, for example.

Figure 2:
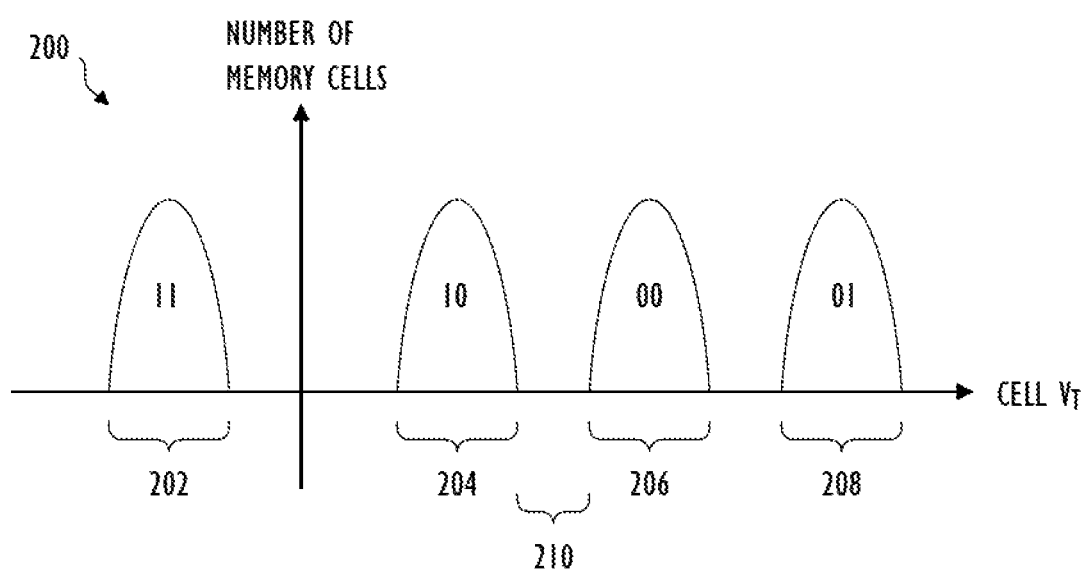
FIG. 2 illustrates a graphical representation of threshold voltage ranges in a population of memory cells.

FIG. 2 illustrates an example of Vt ranges 200 for a population of MLC (four level) (e.g., 2-bit) memory cells. For example, a memory cell might be programmed to a Vt that falls within one of four different Vt ranges 202-208 of 200 mV, each being used to represent a data state corresponding to a bit pattern comprised of two bits. Typically, a dead space 210 (e.g., sometimes referred to as a margin and might have a range of 200 mV to 400 mV) is maintained between each range 202-208 to keep the ranges from overlapping. As an example, if the Vt of a memory cell is within the first of the four Vt ranges 202, the cell in this case is storing a logical '11' state and is typically considered the erased state of the cell. If the Vt is within the second of the four Vt ranges 204, the cell in this case is storing a logical '10' state. A Vt in the third Vt range 206 of the four Vt ranges would indicate that the cell in this case is storing a logical '00' state. Finally, a Vt residing in the fourth Vt range 208 indicates that a logical '01' state is stored in the cell.

Figure 3:
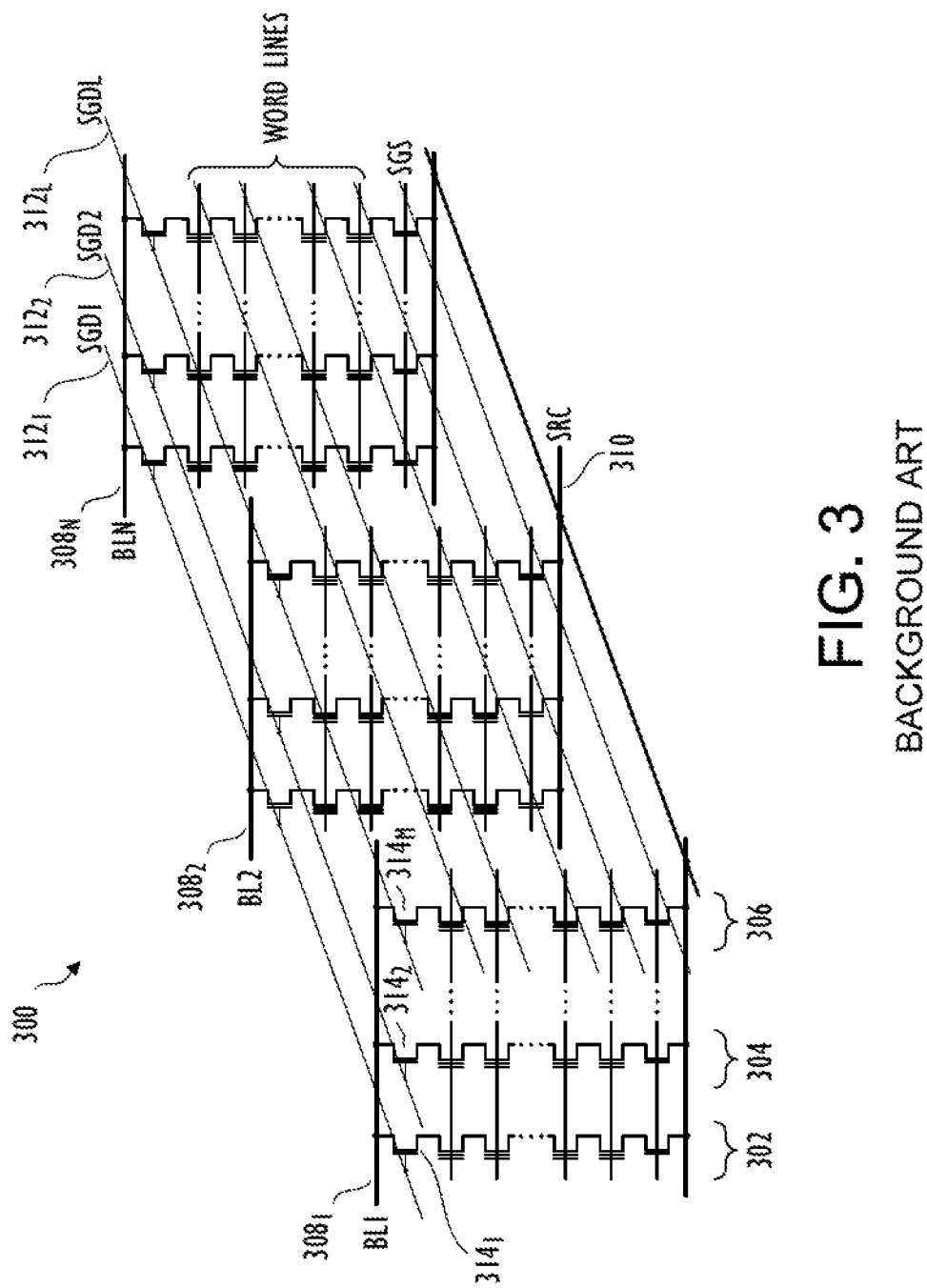
FIG. 3 illustrates a schematic representation of a portion of a 3D array of memory cells.

Various architectures of memory (e.g., non-volatile memory) are utilized to increase the memory density of memory devices. One such architecture is referred to as three-dimensional (3D) memory which incorporates vertical structures which may include semiconductor pillars where at least a portion of each pillar acts as a channel region of the memory cells. FIG. 3 illustrates a schematic representation of a 3D NAND memory array 300. The NAND strings of memory cells are each coupled between a bit line BL1-BLN 308 and a source SRC 310. Multiple strings are coupled to the same bit line, such as strings 302-306. Individual memory cell strings can be selected by biasing the SGD lines, such as lines SGD1-SGDL 312, coupled to control gates of particular drain select gates 314 between each string 302-306 of memory cells and bit line BL1 308₁, for example.

Figure 4:
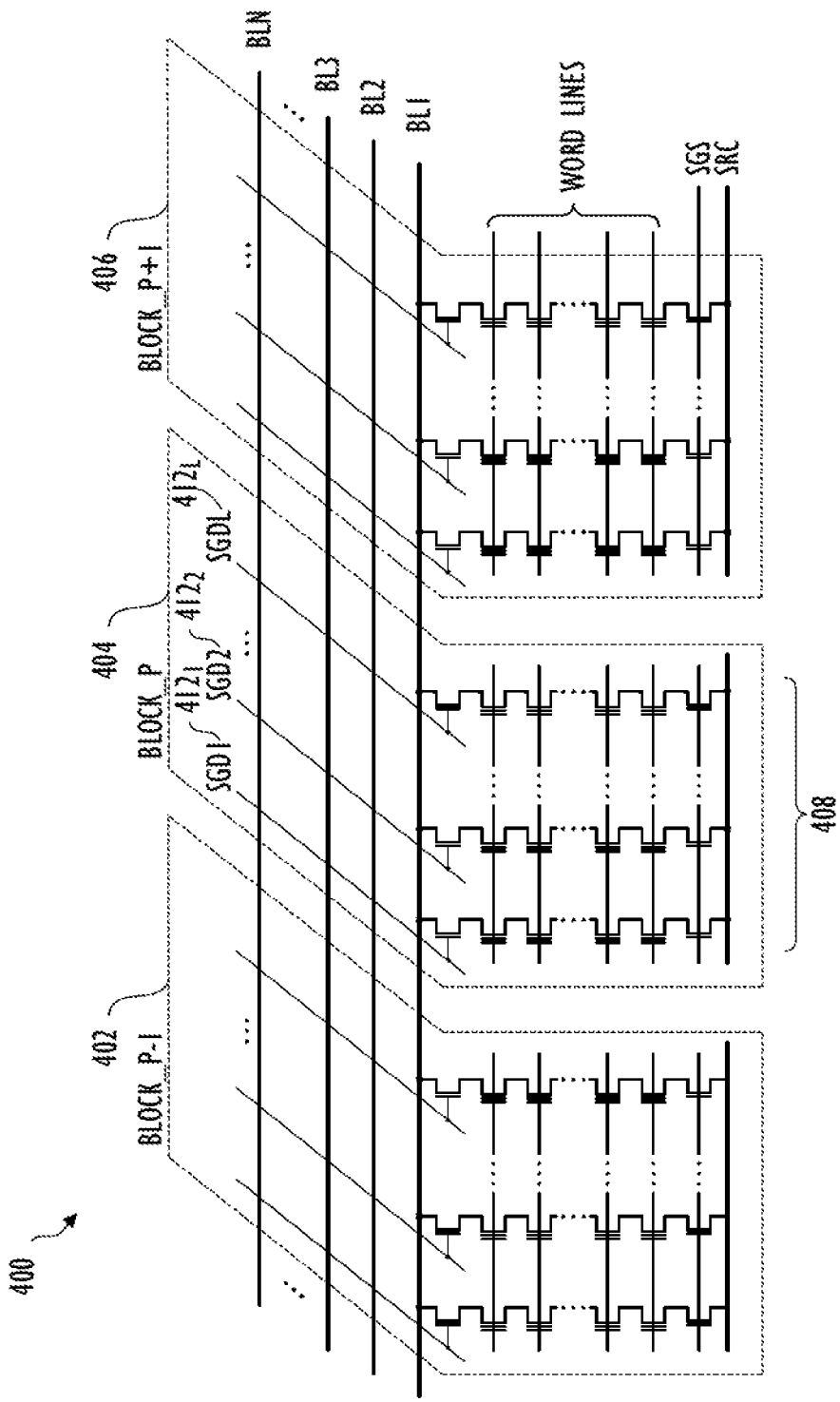
FIG. 4 illustrates an alternate schematic representation of a portion of a 3D array of memory cells.

FIG. 4 illustrates an alternate schematic representation of a 3D NAND memory array 400. The schematic illustrates three blocks 402-406 of NAND strings of memory cells 408. By way of example, each block of NAND strings of memory cells shown in FIG. 4 (e.g., BLOCK_P−1, BLOCK_P, BLOCK_P+1) might comprise a portion of an array such as shown in FIG. 3. Although not shown in FIG. 4, each block might comprise additional strings of memory cells such as behind the plane of the page, for example. The SGD1-SGDL lines 412 shown in FIG. 4 might correspond to the SGD1-SGDL 312 lines shown in FIG. 3. Additionally, the strings 408 indicated in FIG. 4 might correspond to the strings 302-306 shown in FIG. 3, for example.

Figure 5:
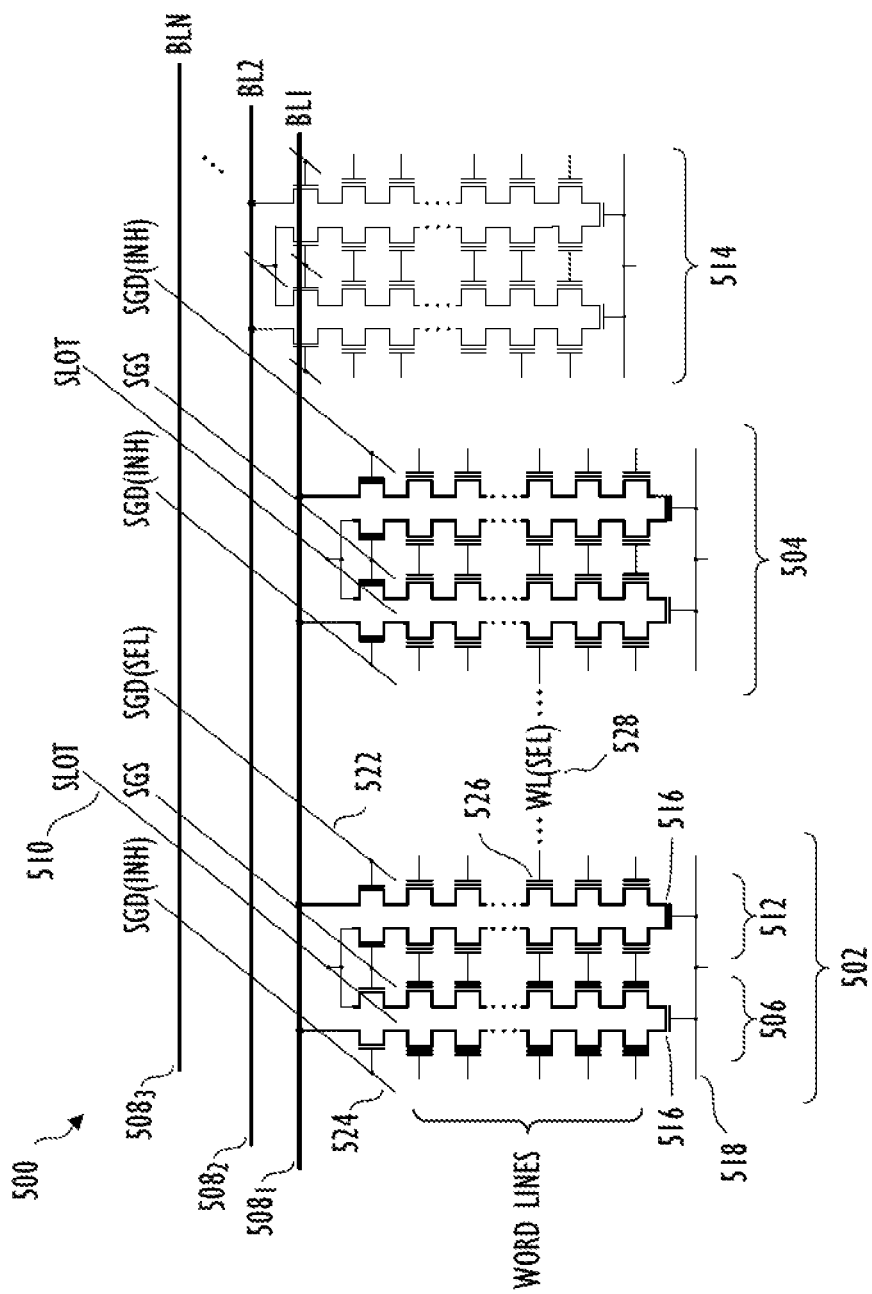
FIG. 5 illustrates an alternate schematic representation of a portion of a 3D array of memory cells.

FIG. 5 illustrates another schematic representation of a 3D NAND of a memory array 500. Groups of strings of memory cells 502, 504, 514 are shown in the figure. The memory array 500 might be further arranged into a plurality of blocks. For example, the strings of memory cells of group 502 might comprise a portion of a first block of memory cells and the strings of memory cells of groups 504, 514 might comprise portions of a second block of memory cells. The strings of memory cells of group 514 are shown in the figure to illustrate that strings of memory cells might be located in different planes of the memory array. Many more strings of memory cells might be present behind and/or in front of the face plane of the page of FIG. 5 but are not shown to improve readability of the figure.

Each string of memory cells of FIG. 5 comprises a U-shaped string of memory cells coupled between a bit line and a source, sometimes referred to as a slot. For example, the strings of memory cells indicated at 506 and 512 and shown coupled between BL1 508₁ and the SLOT 510 comprise two strings of memory cells. At the bottom of each U-shaped string 506, 512 is a connector gate 516 to couple a first portion and a second portion of each U-shaped string of memory cells together. The connector gates 516 are biased by a control line 518 coupled to their control gates. The control line 518 might be biased from approximately 5 to 10V to activate the connector gates 516, for example. Word lines nearest a bit line (e.g., BL1 508₁) and a connector gate (e.g., 516) might comprise edge word lines.

Selecting a particular string of memory cells from a group of strings of memory cells coupled to the same bit line, such as strings 506 and 512 both coupled to BL1 508₁, might comprise biasing the selected SGD line (e.g., SGD(SEL) 522) coupled to a selected select gate between the bit line 508₁ and the selected string (e.g., 512) of memory cells to a particular potential. An inhibited SGD line 524 (e.g., SGD (INH)) coupled to an unselected select gate coupled between the bit line 508₁ and the adjacent string of memory cells, such as string of memory cells 506, might be biased to a potential so as to deselect string of memory cells 506. For example, memory cell 526 might be selected for programming. Thus, SGD(SEL) 522 might be biased to select string of memory cells 512 and SGD(INH) 524 might be biased to deselect string of memory cells 506. During the programming operation, the word line (e.g., WL(SEL) 528) coupled to the selected memory cell 526 might be biased by one or more programming pulses applied to the selected word line.

Figure 6A:
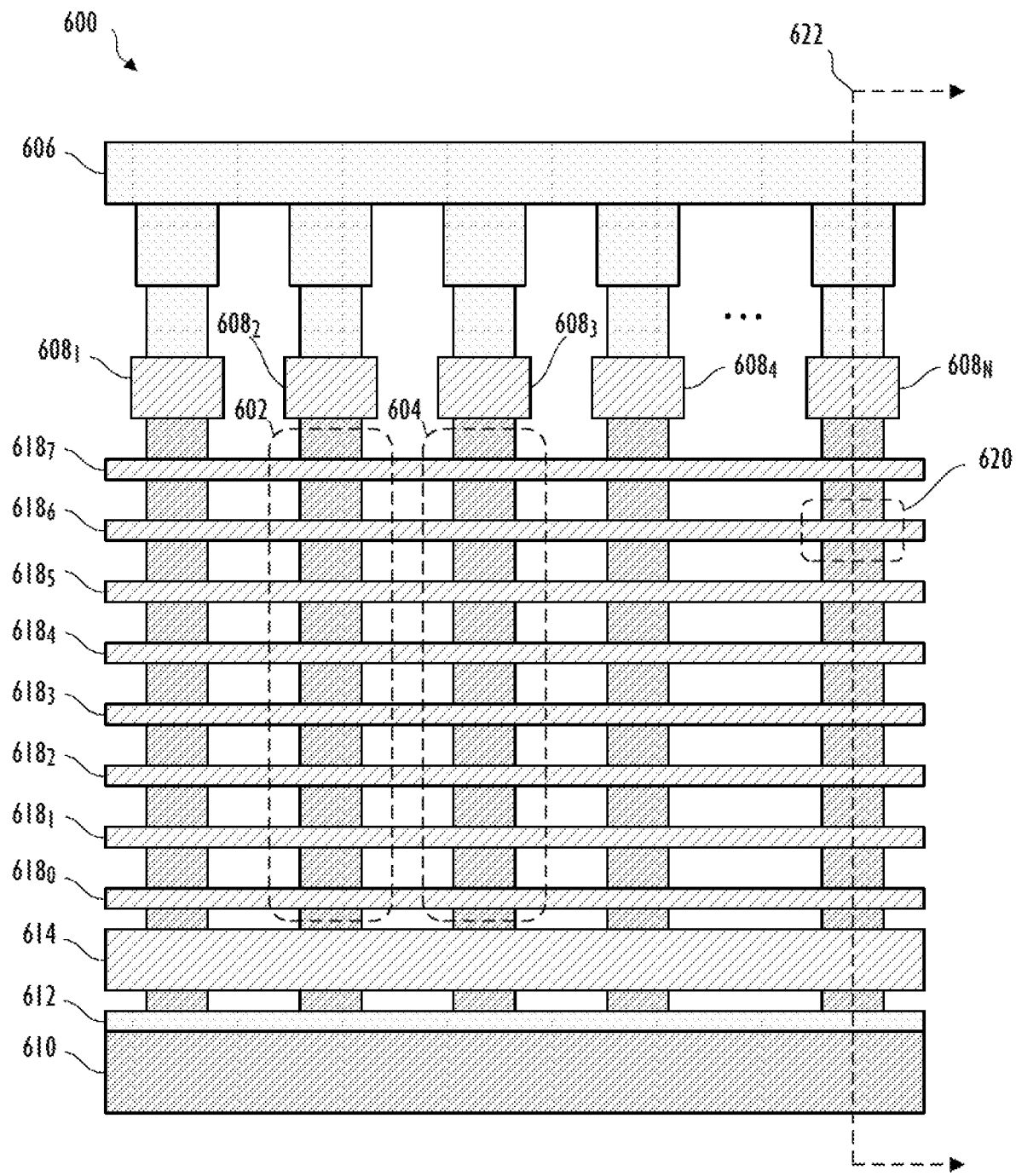
FIG. 6A illustrates a cross-sectional view of a portion of a 3D array of memory cells.

FIG. 6A illustrates a cross-sectional view of an array 600 of vertically formed memory cells (e.g., 3D memory.) The cross-sectional view shown in FIG. 6A might be representative of a plurality of strings of NAND configured memory cells coupled to the same bit line, such as memory cell strings 302-306 shown coupled to bit line BL1 308₁ shown in FIG. 3, for example. The structure encompassed by the dashed line 602 might comprise a first string of memory cells wherein the structure encompassed by the dashed line 604 might comprise a second string of memory cells. The first structure 602 might be representative of a string of memory cells such as string 302 shown in FIG. 3. Whereas the second structure 604 might be representative of a string of memory cells such as 304 also shown in FIG. 3. The strings of memory cells are shown coupled to the same bit line 606 by select gate (e.g., drain select gate) structures 608. The strings of memory cells are also shown to be formed above a semiconductor (e.g., semiconductor substrate) 610. The SRC 310 shown in FIG. 3 might be represented by the layer 612 formed above the substrate 610 as shown in FIG. 6A, for example. The SRC layer 612 is sometimes referred to as a slot. Although not shown in FIG. 6A, the SRC layer 612 might be isolated from the substrate 610 by one or more structures of material (e.g., layers of dielectric material) formed between the SRC layer and the substrate.

FIG. 6A further illustrates a select gate structure 614 (e.g., source select gate) coupled between the memory cell strings and the slot 612. Further, word lines 618 are also shown in FIG. 6A. The region encompassed by the dashed line 620 illustrates a location within the structure 600 of a particular memory cell of a particular string of memory cells. The memory cells might comprise isolated floating gate memory cell structures. Alternatively, the memory cells might incorporate a continuous charge storage structure (e.g., continuous charge storage layer), for example. The floating gate and continuous charge storage structures are not shown in FIG. 6A to improve readability of the figure.

Figure 6B:
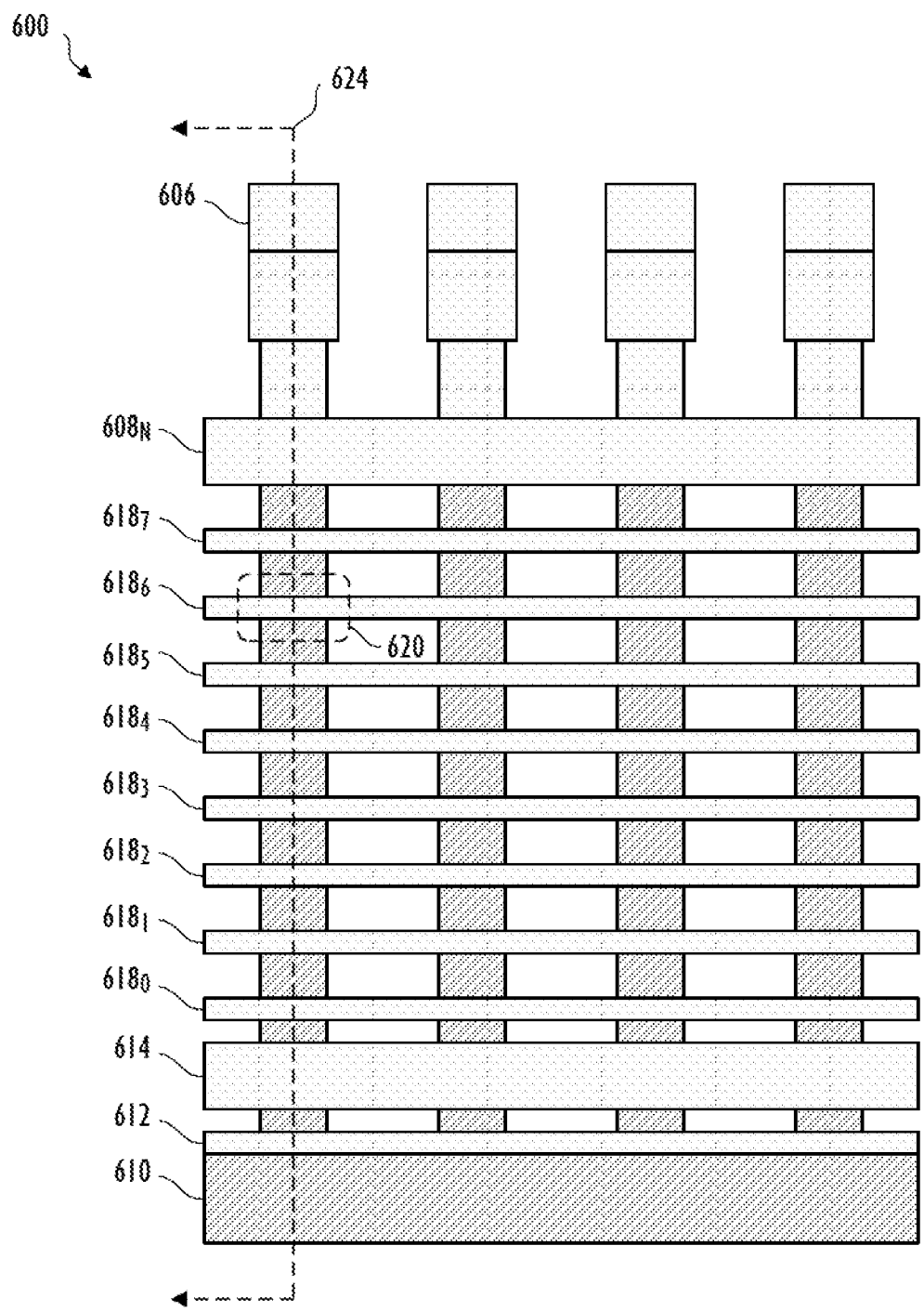
FIG. 6B illustrates an alternate cross-sectional view of a portion of a 3D array of memory cells.

FIG. 6B illustrates an alternate cross-sectional view of the structure shown in FIG. 6A. The view shown in FIG. 6B is that of the viewpoint taken along the view line 622 shown in FIG. 6A. Whereas, the view shown in FIG. 6A is that of the viewpoint taken along the view line 624 shown in FIG. 6B, for example. Bit line 606 shown in FIG. 6B corresponds to the bit line 606 shown in FIG. 6A. The region encompassed by the dashed line 620 shown in FIG. 6B corresponds to the region 620 encompassed by the dashed line shown in FIG. 6A.

Figure 6C:
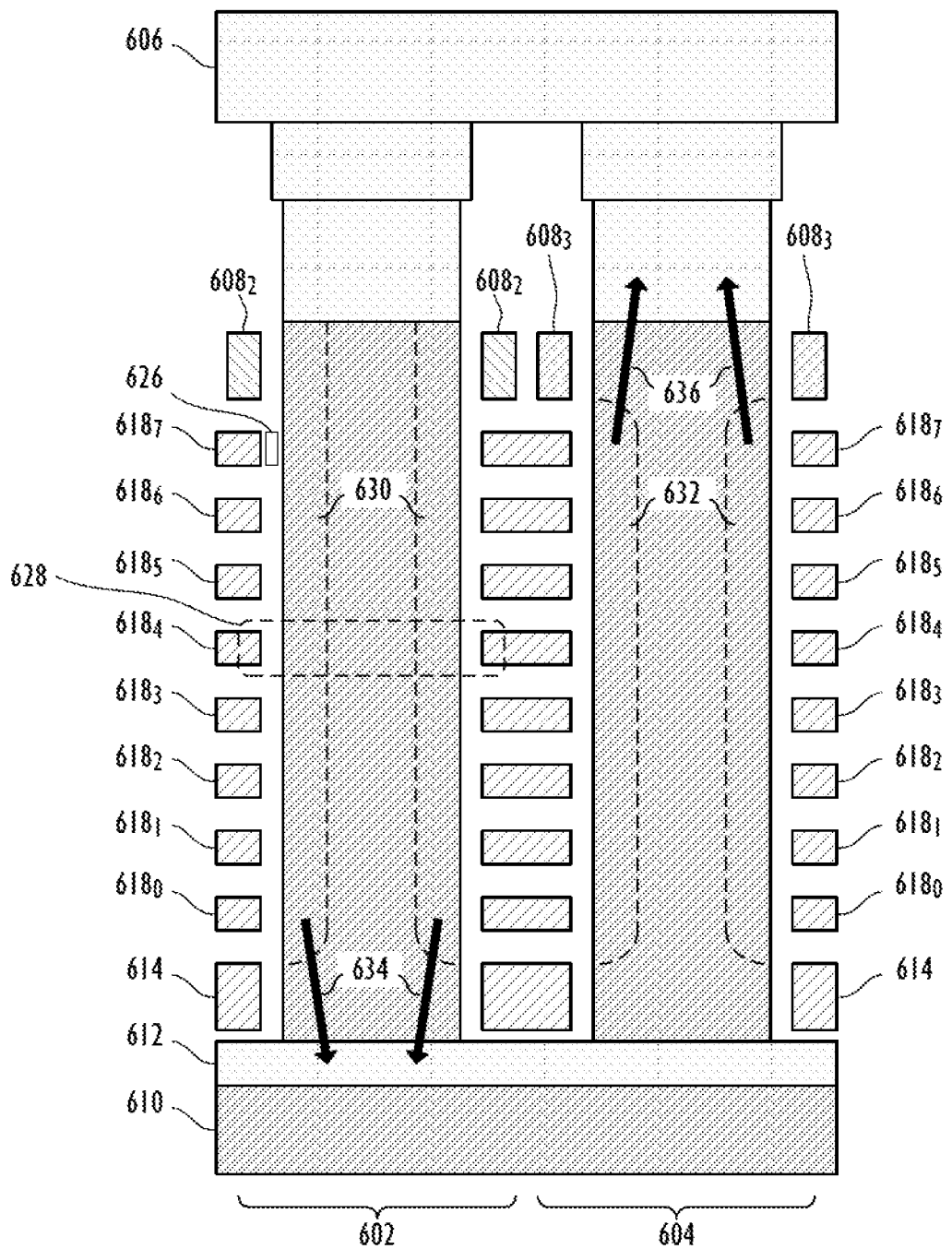
FIG. 6C illustrates a cross-sectional view of a portion of a 3D array of memory cells under typical biasing conditions.

FIG. 6C illustrates a cutaway view of the two structures 602 and 604, shown from the viewpoint of an array as shown in FIG. 6A, for example. The memory cells of FIG. 6C might comprise isolated floating gate memory cells or might comprise continuous charge storage structures. In order to improve readability of the figure, these storage structures are only indicated in FIG. 6C at 626 for one memory cell.

During a programming operation performed in the memory device, one or more undesirable effects might occur. By way of example, a typical programming biasing scheme is discussed by way of reference to FIG. 6C. A particular memory cell 628 of structure 602 might be selected for a programming operation. Whereas, the structure 604 does not include any memory cells selected to be programmed. Both the selected structure 602, i.e. a structure comprising a selected memory cell 628, and the adjacent unselected structure 604 are coupled to the same bit line 606 by the drain select gates 608₂ and 608₃, respectively.

During a typical programming operation, the bit line 606 might be biased to 0V and the slot 612 might be biased to a supply potential Vcc, such as 2.3V, for example. The word line 618₄ coupled to the selected memory cell 628 might receive a programming signal comprising one or more series of pulses which might begin at 15V and increase with each pulse until the selected memory cell has achieved the desired program level. The remaining word lines $618_{7-5}$ and $118_{3-0}$ might be biased to an inhibit potential VINH, such as 10V, for example. Word lines $618_7$ and $618_0$ might be referred to as edge word lines. The source select gate 614 might be biased to a potential, such as 0.5V, as it may be desired to cut off each string from the slot potential (e.g., 2.3V) during the programming operation. The drain select gate $608_2$ of the selected structure 602 might be biased to a potential of 2V to activate the drain select gate to establish a 0V potential in the channel region 630 during the programming operation. The drain select gate $608_3$ of the unselected structure 604 might be biased to 0V to deactivate the drain select gate to facilitate establishing an elevated potential in the channel region 632 as a result of coupling (e.g., capacitive coupling) with the applied word line 618 potentials. The channel regions 632 for the unselected structure 604 might be capacitively coupled up to a potential such as 8V during the programming operation, for example.

However, various leakage currents might occur as a result of the biasing scheme described above with respect to FIG. 6C. These leakage currents can lead to uncertainty and reduced reliability in the resulting biasing conditions during a programming operation. For example, leakage currents represented by the arrows 634 might occur between the channel region 630 and the slot 612 of the selected structure 602. These leakage currents 634 might result in the potential of the channel 630 being pulled up from the intended 0V bias potential towards the slot 612 potential of 2.3V, for example. In addition, leakage currents represented by the arrows 636 between the channel region 632 of the unselected structure 604 and the bit line 606 might decrease the resulting potential of the channel 632 from the intended potential of 8V as described above.

Figure 7:
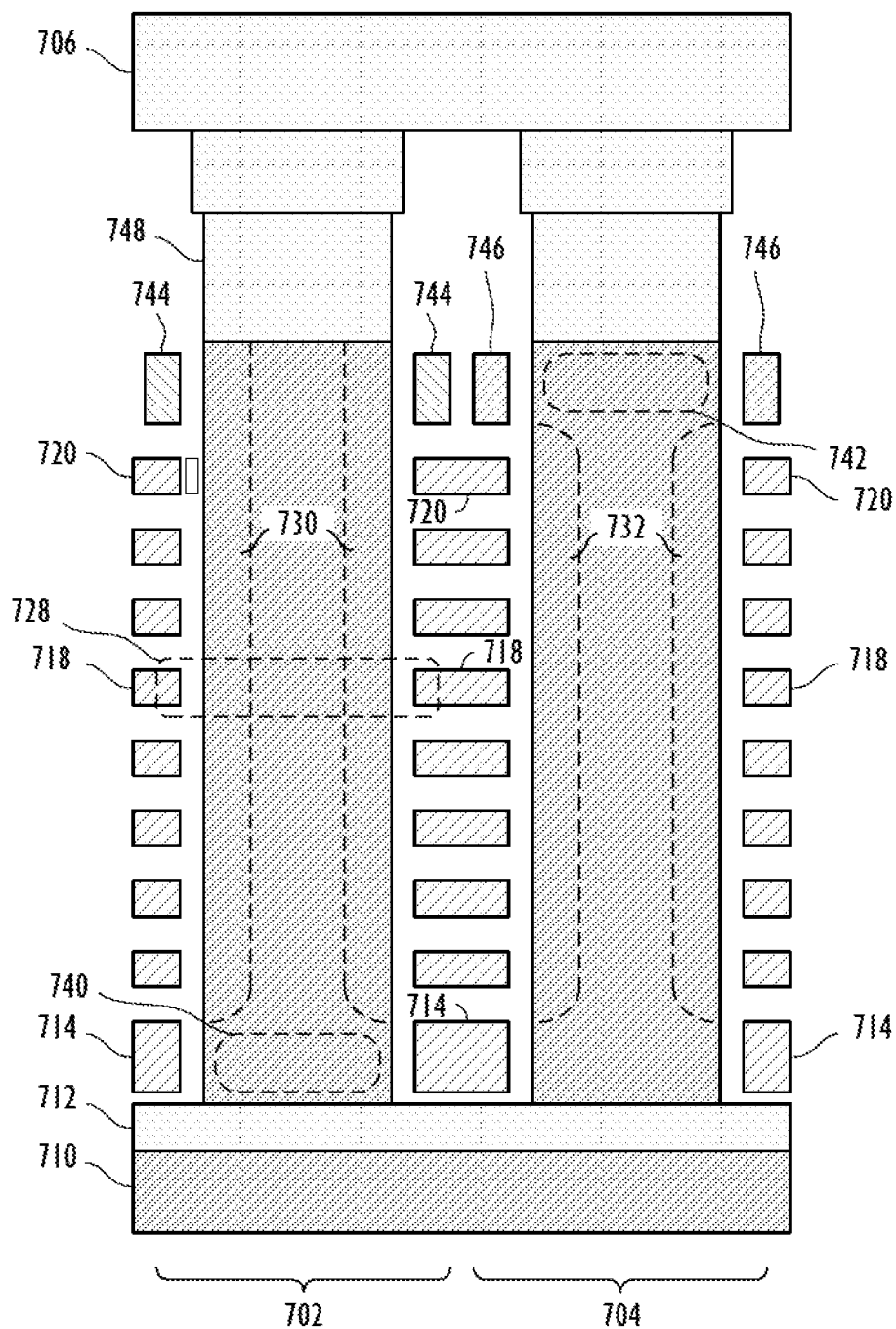
FIG. 7 illustrates a cross-sectional view of a portion of a 3D array of memory cells under biasing conditions according to an embodiment of the present disclosure.

Biasing methods according to various embodiments of the present disclosure can facilitate a reduction in the above-mentioned leakage currents, such as indicated at 634 and 636, which can improve the reliability of resulting bias conditions within the memory array during a programming operation, for example. Biasing methods according to one or more embodiments might be presented by way of reference to FIG. 7. FIG. 7 illustrates a cutaway view of a similar memory array structure as that shown in FIG. 6C. However, FIG. 7 illustrates a reduction in leakage currents in the regions 740 and 742 as compared to those leakage currents (e.g., as indicated by arrows 634, 636) described above with respect to FIG. 6C. FIG. 7 illustrates a selected structure 702 comprising a string of memory cells where the string of memory cells comprises a memory cell selected for programming as indicated at region 728. The adjacent structure 704 comprising a string of memory cells does not comprise a memory cell selected for programming.

Structures 702 and 704 are both coupled to the same bit line 706 by separate drain select gates 744 and 746, respectively. Thus, the channel region 730 of selected structure 702 and the channel region 732 of the unselected structure 704 might be independently coupled between the memory cells of their respective strings and the bit line 706 by independently biasing the drain select gates (e.g., 744, 746) of each structure 702 and 704. For example, drain select gate 746 of unselected structure 704 might be deactivated and drain select gate 744 of selected structure 702 might be activated while bit line 706 and source line 712 (e.g., slot) are biased to a particular potential during a programming operation according to one or more embodiments of the present disclosure. A source select gate structure 714 is shown in FIG. 7 according to one or more embodiments of the present disclosure. A portion of source select gate structure 714 of structure 702 might be configured to be concurrently activated and deactivated along with a portion of source select gate structure 714 of structure 704 according to various embodiments of the present disclosure, for example.

According to one or more embodiments, the structure shown in FIG. 7 might comprise a portion of a floating body architecture memory array. This type of structure might be configured wherein a portion of each pillar (e.g., regions between the channel regions 730 and/or 732) may be floating during a programming and/or erase operation performed on the memory array, for example. The pillars (e.g., body regions) might comprise a p-type material (e.g., p-type polysilicon) whereas a drain region 748 and the source line 712 might comprise an n-type material (e.g., n+ polysilicon) in contact with the p-type material of the pillars. Thus, a structure of the n-type drain region, p-type pillar, and an n-type source line might comprise an n-p-n transistor structure according to various embodiments of the present disclosure, for example.

Figure 8:
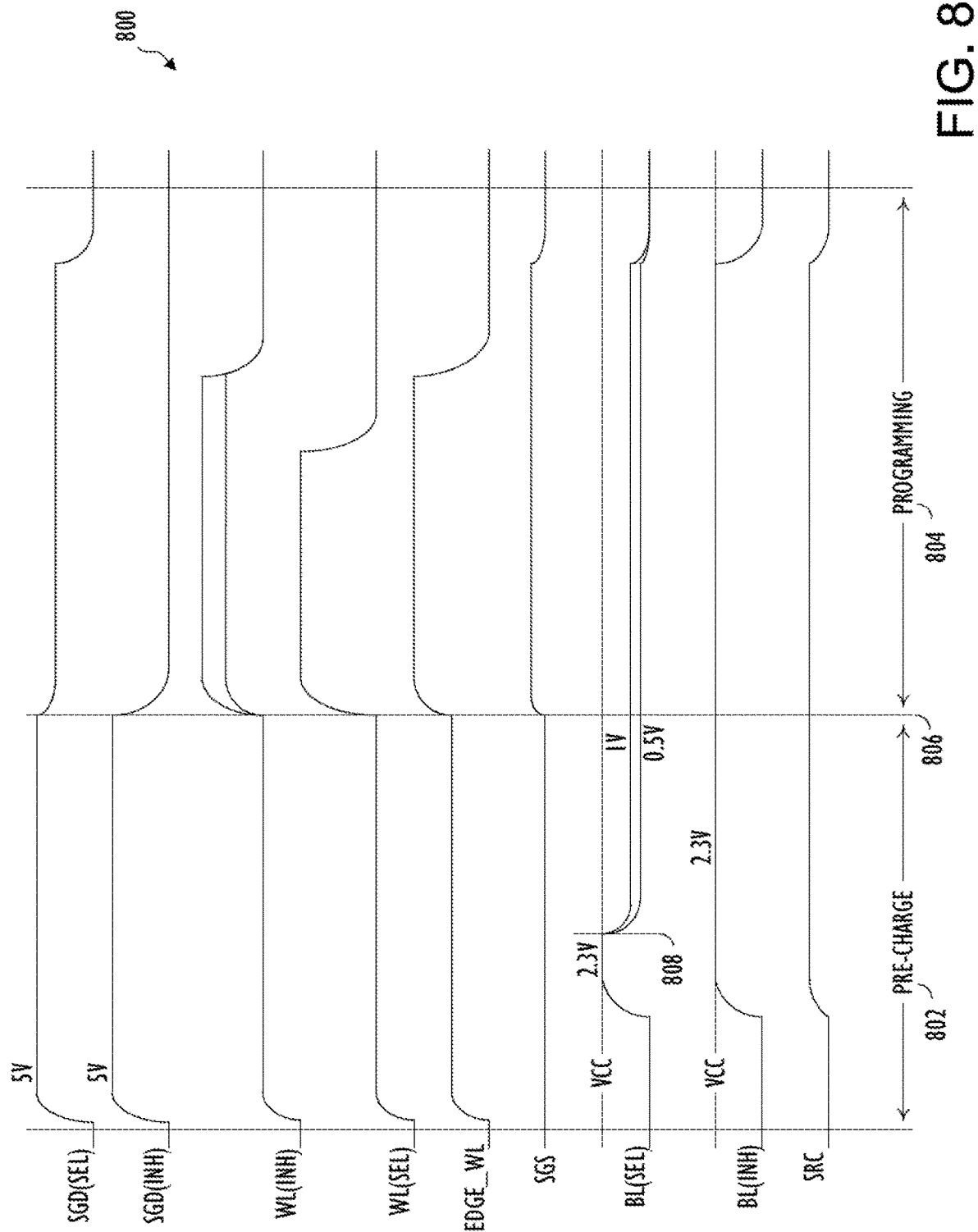
FIG. 8 illustrates a plot of waveforms according to an embodiment of the present disclosure.

FIG. 8 illustrates waveforms 800 developed in facilitating one or more biasing methods according to various embodiments of the present disclosure. Two phases of performing a programming operation are illustrated in FIG. 8. A pre-charge (e.g., seeding) phase 802 is performed followed by a programming phase 804. The absolute magnitudes, relative magnitudes and/or durations (e.g., time) of the signals shown are not meant to be limiting but are intended to be illustrative in describing one or more embodiments according to the present disclosure.

The waveforms shown in FIG. 8 are discussed by way of example of a programming operation performed on a selected memory cell, such as memory cell 728 of FIG. 7. Table 1 provides an example of biasing conditions applied during the programming phase 804 shown in FIG. 8 and in accordance with one or more embodiments of the present disclosure. Table 1 is divided into a SELECTED BLOCK column and a DE-SELECTED BLOCK column. The SELECTED BLOCK column might correspond to a block of memory cells comprising one or more memory cells selected for a programming operation, such as BLOCK_P 404 as shown in FIG. 4. The DE-SELECTED BLOCK column might correspond to a block of memory cells which do not comprise memory cells selected for programming, such as BLOCK_P−1 402 and/or BLOCK_P+1 406 shown in FIG. 4, for example. The SGD(SEL) signal shown in FIG. 8 and Table 1 might correspond to the potential applied to the SGD structure 744, whereas the SGD(INH) signal of FIG. 8 might correspond to a potential applied to the SGD structure 746 of FIG. 7. WL(INH) (i.e., unselected word lines) of FIG. 8 might correspond to potentials applied to word lines coupled to one or more memory cells other than the selected memory cell 728. WL(SEL) (i.e., selected word line) of FIG. 8 might correspond to the potential applied to the selected word line 718 coupled to the selected memory cell 728. EDGE_WL of FIG. 8 might correspond to a potential applied to the edge word line 720 of FIG. 7.

SGS of FIG. 8 might correspond to a potential applied to the SGS structure 714, BL(SEL) (i.e., selected bit line) might correspond to a potential applied to the bit line 706 and BL(INH) (i.e., unselected bit line) might correspond to potentials applied to one or more bit lines (not shown in FIG. 7) which are not coupled to the one or more memory cells selected for programming. SRC of FIG. 8 might correspond to a potential applied to the slot structure 712.

During the pre-charge phase 802 the SGD(SEL), SGD (INH), WL(INH), WL(SEL) and EDGE_WL potentials shown in FIG. 8 are applied to their respective structures of the array. Following the application of these potentials, the BL(SEL), BL(INH) and SRC potentials are applied as indicated in FIG. 8. Following a particular period of time (e.g., after establishing a steady state bias level on BL(SEL)), the BL(SEL) potential can be adjusted to a lower potential than originally applied as indicated at time 808, for example. The potentials (e.g., 0.5V and 1V) shown on BL(SEL) in FIG. 8 are intended to be illustrative and not limiting. The potentials applied to one or more selected bit lines might depend on a difference between a present and a desired threshold voltage (Vt) of one or more selected memory cells undergoing a programming operation, for example.

The transition from the pre-charge phase 802 to the programming phase 804 is indicated at time 806. Responsive to initiating the programming phase 804, the SGD(SEL) and SGD(INH) potentials decrease as shown in FIG. 8 to a level indicated in Table 1. Substantially concurrently, WL(INH), WL(SEL), EDGE_WL and the SGS potential levels increase as shown in FIG. 8 and as indicated in Table 1. For example, the WL(INH) bias is adjusted to a Vpass potential, such as to 10V, for example. The Vpass potential might be a constant potential (e.g., Vinh of 10V) across all unselected word lines and/or the Vpass potential might change (e.g., Vbias of 0-6V) dependent upon various conditions, such as proximity of an unselected word line to the selected word line. Thus, by biasing one or more unselected word lines to a Vpass potential, a channel potential might be induced, such as in the channel region 730, which is substantially equal (e.g., equal) to the BL(SEL) potential applied to bit line 706, for example.

The WL(SEL) bias potential comprises a programming potential applied to the word line coupled to the selected memory cell, such as word line 718 of FIG. 7, for example. This applied programming potential (e.g., Vpgm programming pulse) might increase from 15V up to 20V, for example. It should be noted that the edge word lines might be biased to a potential the same as other unselected word lines or might be biased to a different potential such as indicated in Table 1. When the selected word line comprises an edge word line, that edge word line might be biased as the WL(SEL) (i.e., selected word line).

Various embodiments according to the present disclosure might be described by further reference to Table 1 and to the memory array shown in FIG. 7. For example, memory cell 728 might be selected for programming. Thus, it may be desirable to have a predictable and consistent potential difference between the channel region 730 and the programming potential (e.g., Vpgm) applied to the selected word line 718 during a programming operation, for example. It may further be desirable to have a predictable and consistent channel potential established in the channel region 732 of the structure 704 which does not comprise a selected memory cell. For example, a desirability to have a consistent channel potential of 8V established through capacitive coupling as discussed above. Continuing with the present example, the channel region 730 might be more consistently biased by biasing the selected bit line (e.g., coupled to a string of memory cells comprising a selected memory cell 728) to substantially the same potential (e.g., the same potential) as the slot. For example, the slot might be biased to a potential of 0.5V and the selected bit line might be biased to a potential that is +/−0.5V of the slot potential. Although, not shown in Table 1, the selected bit line and the slot might be commonly biased to a potential such as 0V according to one or more embodiments of the present disclosure. Further, by biasing the SGS line to substantially the same potential as the slot potential, an additional reduction in leakage currents between the channel 730 and the slot 712 might be achieved. The various embodiments are not limited to biasing the SGS line and the slot to the same potential. The slot might be biased to 0.5V whereas the SGS line might be biased to 0.3V during a programming operation, for example.

Continuing with the same example, methods according to various embodiments of the present disclosure might further improve the consistency of the channel 732 potential of the unselected structure 704 which is coupled to the selected bit line. For example, although the SGD structure 746 might be biased to 0V, leakage might still occur through the drain select gate 746. However, by biasing the selected bit line, such as to 0.5V as shown in Table 1, the potential difference between the channel 732 and the bit line is reduced. This facilitates a reduction in leakage between the channel 732 boosted up to a potential by capacitive coupling (e.g., to 8V) and the selected bit line during the programming operation.

Thus, biasing the selected bit line and the slot to substantially the same potential and/or biasing the slot and the SGS line to substantially the same potential according to one or more embodiments might facilitate an improvement in programming stabilization, for example. Further, by biasing one or more selected bit lines to a positive potential equal to or greater than the SGD (e.g., SGD(INH)) line might facilitate an improvement in boosting characteristics, such as the boosted channel region 732 (e.g., through capacitive coupling) of an unselected structure 704, for example.

TABLE 1

| SIGNAL | SELECTED BLOCK | | DE-SELECTED BLOCK | |
| --- | --- | --- | --- | --- |
| | SELECTED | INHIBITED | SELECTED | INHIBITED |
| BL | 0 V-1 V | ~2.3 V | 0 V-1 V | ~2.3 V |
| WL | Vpgm 15 V-20 V | Vinh ~10 V Vbias 0 V~6 V | 0 V | 0 V |
| EDGE WL | N/A | Vbias 0 V~6 V | 0 V | 0 V |
| SGD | SGD(SEL) 2 V, SGD(INH) 0 V~0.5 V | | 0 V | |
| SGS | 0 V-0.5 V | | 0 V | 0 V |
| SLOT | 0 V-1.5 V | | 0 V-1.5 V | |
| PWELL (PILLAR) | Floating | | Floating | |

The pre-charge 802 and programming 804 phases and applied potentials as shown in FIG. 8 and Table 1 might be repeated one or more times, such as until all memory cells selected for programming have completed programming according to various embodiments of the present disclosure. It should also be noted that more than one bit line of a particular block of memory cells might be selected and biased as discussed with respect to Table 1 and according to various embodiments of the present disclosure. For example, bit lines BL1 308$_1$ and BLN 308N shown in FIG. 3 might comprise selected bit lines and bit line BL2 3082 might be inhibited such as shown in Table 1. A subsequent programming operation might inhibit bit lines BL1 308$_1$ and BLN 308N shown in FIG. 3 and BL2 3082 might comprise a selected bit line and be biased under the conditions shown in Table 1 according to one or more embodiments of the present disclosure, for example.

Methods according to the various embodiments of the present disclosure, such as the programming operations discussed above with respect to FIG. 7 and Table 1, might be performed on a number of memory array configurations. These methods might be performed on the 3D NAND memory arrays discussed above with respect to FIGS. 3, 4 and 5, for example. Such arrays may include floating body architecture memory array structures configured to exhibit floating body characteristics during programming operations according to various embodiments of the present disclosure.

Figure 9:
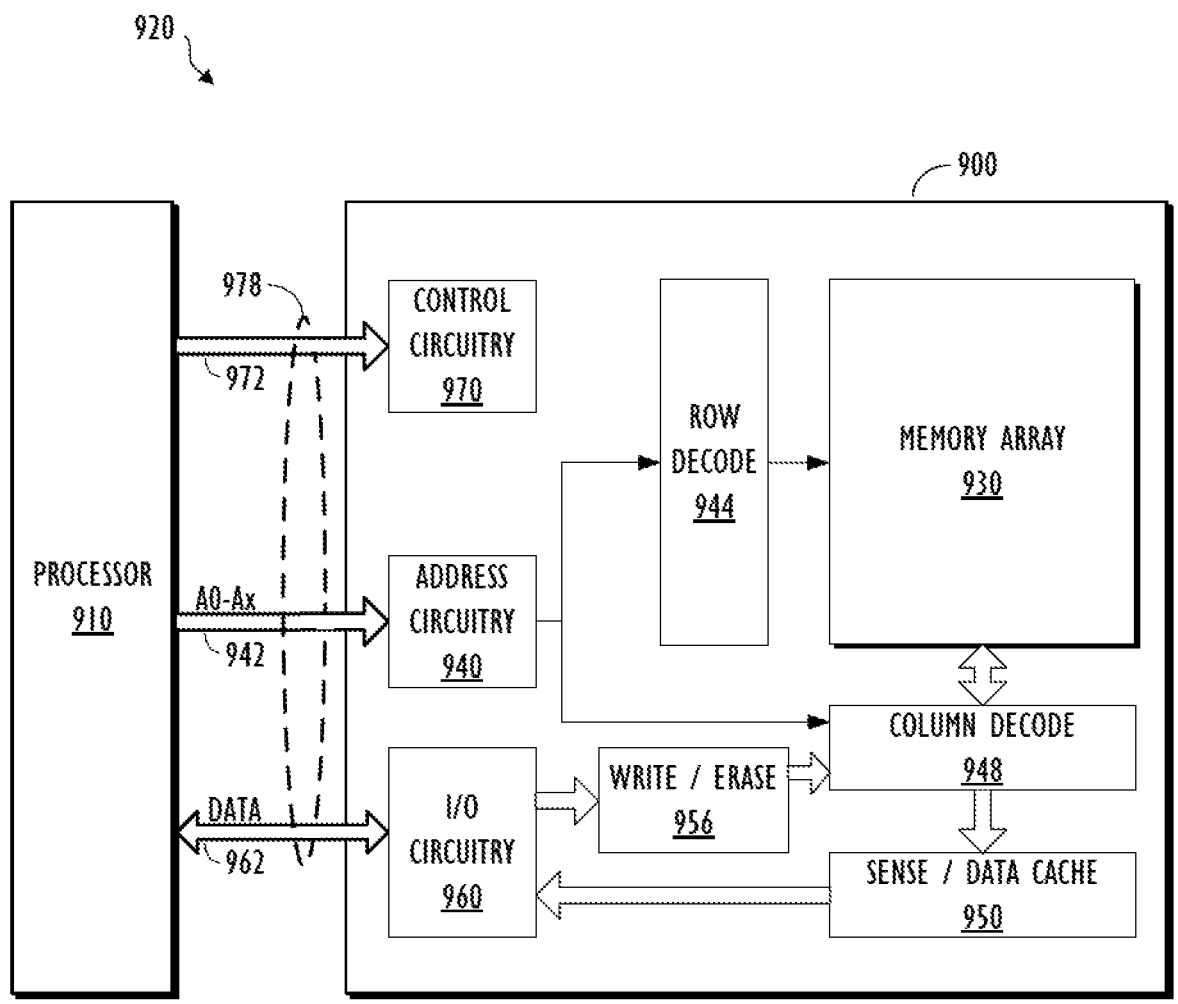
FIG. 9 is a simplified block diagram of a memory device coupled to a memory access device as part of an electronic system according to an embodiment of the present disclosure.

FIG. 9 is a functional block diagram of an electronic system having at least one memory device according to one or more embodiments of the present disclosure. The memory device 900 illustrated in FIG. 9 is coupled to a memory access device, such as a processor 910. The processor 910 may be a microprocessor or some other type of controlling circuitry. The memory device 900 and the processor 910 form part of an electronic system 920. The memory device 900 has been simplified to focus on features of the memory device that are helpful in understanding various embodiments of the present disclosure.

The memory device 900 includes one or more memory arrays 930 that might be logically arranged in banks of rows and columns. According to one or more embodiments, the memory cells of memory array 930 are flash memory cells configured as a 3D NAND array. The memory array 930 might include multiple banks and blocks of memory cells residing on a single or multiple die as part of the memory device 900. Memory array 930 might comprise SLC and/or MLC memory. The memory array 930 might also be adaptable to store varying densities (e.g., MLC (four level) and MLC (eight level)) of data in each cell, for example.

An address buffer circuit 940 is provided to latch address signals provided on address input connections AO-Ax 942. Address signals are received and decoded by a row decoder 944 and a column decoder 948 to access the memory array 930. Row decoder 944 might comprise driver circuitry configured to bias the word lines of the memory array 930, for example. It will be appreciated by those skilled in the art, with the benefit of the present description, that the number of address input connections 942 might depend on the density and architecture of the memory array 930. That is, the number of address digits increase with both increased memory cell counts and increased bank and block counts, for example.

The memory device 900 reads data in the memory array 930 by sensing voltage or current changes in the memory array columns using sense devices, such as sense/data cache circuitry 950. The sense/data cache circuitry 950, in at least one embodiment, is coupled to read and latch a row of data from the memory array 930. The sense/data cache circuitry 950 might comprise driver circuitry to bias bit lines to various potentials according to one or more embodiments of the present disclosure. Data input and output (I/O) buffer circuitry 960 is included for bi-directional data communication over a plurality of data connections 962 with the processor 910. Write/erase circuitry 956 is provided to write data to or to erase data from the memory array 930.

Control circuitry 970 is configured, at least in part, to facilitate implementing various embodiments of the present disclosure. Control circuitry 970 might be coupled (not shown) to one or more of the elements of the memory device 900. For example, the control circuitry might be coupled to the row decoder 944 and configured to cause the row decoder driver circuitry to bias particular word lines of the memory array 930 according to various embodiments of the present disclosure. Control circuitry 970 might be coupled (not shown) to and configured to cause the sense/data cache driver circuitry 950 to bias particular bit lines of the array 930 according to one or more embodiments. In one embodiment, control circuitry 970 and/or firmware or other circuitry can individually, in combination, or in combination with other elements, form an internal controller. As used herein, however, a controller need not necessarily include any or all of such components. In some embodiments, a controller can comprise an internal controller (e.g., located on the same die as the memory array) and/or an external controller. In at least one embodiment, the control circuitry 970 may utilize a state machine.

Control signals and commands can be sent by the processor 910 to the memory device 900 over the command bus 972. The command bus 972 may be a discrete signal or may be comprised of multiple signals, for example. These command signals 972 are used to control the operations on the memory array 930, including data read, data write (e.g., program), and erase operations. The command bus 972, address bus 942 and data bus 962 may all be combined or may be combined in part to form a number of standard interfaces (e.g., communications interfaces) 978. For example, the interface 978 between the memory device 900 and the processor 910 might be a Universal Serial Bus (USB) interface. The interface 978 might also be a standard interface used with many hard disk drives (e.g., SATA, PATA) as are known to those skilled in the art.

The electronic system illustrated in FIG. 9 has been simplified to facilitate a basic understanding of the features of the memory and is for purposes of illustration only. A more detailed understanding of internal circuitry and functions of non-volatile memories are known to those skilled in the art.

CONCLUSION

In summary, one or more embodiments of the present disclosure provide methods of biasing memory arrays, such as 3D NAND memory arrays, in memory devices, e.g., non-volatile memory devices. These methods might facilitate increased predictability in resulting biasing conditions during operation of the memory device. These methods might facilitate a significant increase the reliability and consistency of biasing conditions within the array of memory cells during a programming and/or erase operation, for example. A reduction in program disturb and charge leakage phenomenon might also be realized.

Although specific embodiments have been illustrated and described herein, it will be appreciated by those of ordinary skill in the art that other configurations may be substituted for the specific embodiments shown. Many adaptations of the disclosure will be apparent to those of ordinary skill in the art. Accordingly, this application is intended to cover any adaptations or variations of the disclosure.

What is claimed is:

1. A memory device, comprising:
a first data line selectively connected to a first end of a first string of series-connected memory cells;
a second data line selectively connected to a first end of a second string of series-connected memory cells;
a first select gate connected in series between the first end of the first string of series-connected memory cells and the first data line; and
a second select gate connected in series between the first end of the second string of series-connected memory cells and the second data line:
a controller, wherein the controller is configured to cause the memory device to perform a method comprising:
applying a first voltage level to the first data line while applying a second voltage level, higher than the first voltage level, to the second data line;

while applying the first voltage level to the first data line and while applying the second voltage level to the second data line, applying a third voltage level to a particular access line coupled to a memory cell of the first string of series-connected memory cells selected for programming; and while applying the first voltage level to the first data line and while applying the second voltage level to the second data line, applying a fourth voltage level to a control gate of the second select gate, wherein a differential between the third voltage level and the first voltage level is configured to increase a threshold voltage of the memory cell selected for programming; and wherein the first voltage level is a positive voltage level higher than or equal to the fourth voltage level.

2. The memory device of claim 1, wherein the method that the controller is configured to cause the memory device to perform further comprises applying a fifth voltage level to a control gate of the first select gate while applying the first voltage level to the first data line and while applying the second voltage level to the second data line, wherein the fifth voltage level is higher than the first voltage level.

3. The memory device of claim 1, wherein the third voltage level applied to the particular access line while applying the second voltage level to the second data line and while applying the fourth voltage level to the control gate of the second select gate is configured to inhibit increasing a threshold voltage of a memory cell of the second string of series-connected memory cells coupled to the particular access line.

4. The memory device of claim 1, wherein the method that the controller is configured to cause the memory device to perform further comprises applying a respective voltage level to each remaining access line coupled to any memory cell of the first string of series-connected memory cells not selected for programming while applying the third voltage level to the particular access line, wherein the respective voltage levels applied to each remaining access line coupled to any memory cell of the first string of series-connected memory cells not selected for programming are each lower than the third voltage level.

5. The memory device of claim 4, wherein the respective voltage level applied to a particular remaining access line coupled to a memory cell of the first string of series-connected memory cells not selected for programming is different than the respective voltage level applied to a different remaining access line coupled to a memory cell of the first string of series-connected memory cells not selected for programming.

6. A memory device, comprising:
a first data line selectively connected to a first end of a first string of series-connected memory cells;
a second data line selectively connected to a first end of a second string of series-connected memory cells;
a first select gate connected in series between the first data line and the first end of the first string of series-connected memory cells;
a second select gate connected in series between the second data line and the first end of the second stringy of series-connected memory; cells;
a particular access line coupled to a first memory cell of the first string of series-connected memory cells selected for programming and coupled to a second memory cell of the second string of series-connected memory cells to be inhibited from programming; and a controller, wherein the controller is configured to cause the memory device to perform a method comprising:
applying a first voltage level to the first data line while applying the first voltage level to the second data line;
applying a second voltage level, lower than the first voltage level, to the first data line while continuing to apply the first voltage level to the second data line;
while applying the second voltage level to the first data line and while applying the first voltage level to the second data line, applying a third voltage level to the particular access line; and
while applying the second voltage level to the first data line, and while applying the first voltage level to the second data line, and while applying the third voltage level to the particular access line:
activating the first select gate comprising applying a voltage level higher than the second voltage level to a control gate of the first select gate; and
deactivating the second select gate comprising applying a voltage level lower than or equal to the second voltage level to a control gate of the second select gate;
wherein a differential between the third voltage level and the second voltage level is configured to increase a threshold voltage of the first memory cell; and
wherein the second voltage level is a positive voltage level.

7. The memory device of claim 6, wherein the first voltage level is higher than or equal to 0.5V and lower than or equal to 1V.

8. The memory device of claim 6, wherein the third voltage level applied to the particular access line while applying the second voltage level to the second data line and while applying the voltage level lower than or equal to the second voltage level to the control gate of the second select gate is configured to inhibit increasing a threshold voltage of a memory cell of the second string of series-connected memory cells coupled to the particular access line.

9. A memory device, comprising:
a first data line selectively connected to a first end of a first string of series-connected memory cells;
a second data line selectively connected to a first end of a second string of series-connected memory cells,
a first select gate connected in series between the first data line and the first end of the first string of series-connected memory cells;
a second select gate connected in series between the second data line and the first end of the second string of series-connected memory cells;
a third select gate connected in series between a source and a second end of the first string of series-connected memory cells;
a fourth select gate connected in series between the source and the second end of the second string of series-connected memory cells;
a particular access line coupled to a first memory cell of the first string of series-connected memory cells selected for programming and coupled to a second memory cell of the second string of series-connected memory cells to be inhibited from programming; and
a controller, wherein the controller is configured to cause the memory device to perform a method comprising:
applying a first voltage level to the first data line while applying the first voltage level to the second data line;

applying a second voltage level, lower than the first voltage level, to the first data line while continuing to apply the first voltage level to the second data line, while applying the second voltage level to the first data line and while applying the first voltage level to the second data line, applying a third voltage level to the particular access line; and while applying the second voltage level to the first data line, and while applying the first voltage level to the second data line, and while applying the third voltage level to the particular access line:
  activating the first select gate;
  deactivating the second select gate;
  deactivating the third select gate; and
  deactivating the fourth select gate;

wherein a differential between the third voltage level and the second voltage level is configured to increase a threshold voltage of the first memory cell; and wherein the second voltage level is a positive voltage level.

10. The memory device of claim 9, wherein, in the method that the controller is configured to cause the memory device to perform, deactivating the third select gate comprises deactivating the third select gate by applying a voltage level to a control gate of the third select gate that is higher than a voltage level applied to a control gate of the fourth select gate while deactivating the fourth select gate.

11. The memory device of claim 9, wherein the method that the controller is configured to cause the memory device to perform further comprises applying a fourth voltage level to the source while deactivating the third select gate and while deactivating the fourth select gate, wherein the fourth voltage level is higher than the second voltage level.

12. The memory device of claim 9, wherein the method that the controller is configured to cause the memory device to perform further comprises applying a fourth voltage level to the source while deactivating the third select gate and while deactivating the fourth select gate, wherein the fourth voltage level is lower than or equal to the second voltage level.

13. The memory device of claim 9, further comprising:
a fifth select gate connected in series between the first data line and a first end of a third string of series-connected memory cells; and
a sixth select gate connected in series between the source and a second end of the third string of series-connected memory cells;
wherein the particular access line is further coupled to a third memory cell of the third string of series-connected memory cells to be inhibited from programming; and
wherein the method that the controller is configured to cause the memory device to
perform further comprises:
  deactivating the fifth select gate while activating the first select gate; and
  deactivating the sixth select gate while deactivating the third select gate.

14. An electronic system, comprising:
a communications interface;
a memory access device coupled to the communications interface; and
a memory device coupled to the communications interface, the memory device comprising:
  a first data line selectively connected to a first end of a first string of series-connected memory cells;
  a second data line selectively connected to a first end of a second string of series-connected memory cells; and
  a controller, wherein the controller is configured to cause the memory device to perform a method comprising:
    applying a positive first voltage level to the first data line while applying a second voltage level, higher than the first voltage level, to the second data line;
    connecting the first data line to the first end of the first string of series-connected memory cells while applying the first voltage level to the first data line and while applying a second voltage level to the second data line;
    isolating the second data line from the first end of the second string of series-connected memory cells while connecting the first data line to the first end of the first string of series-connected memory cells;
    isolating a second end of the first string of series-connected memory cells from a source and isolating a second end of the second string of series-connected memory cells from the source while connecting the first data line to the first end of the first string of series-connected memory cells and while isolating the second data line from the first end of the second string of series-connected memory cells; and
    applying a third voltage level to a particular access line coupled to a memory cell of the first string of series-connected memory cells selected for programming while connecting the first data line to the first end of the first string of series-connected memory cells and while isolating the second data line from the first end of the second string of series-connected memory cells;
    wherein the third voltage level applied to the particular access line is configured to increase a threshold voltage of the memory cell selected for programming while connecting the first data line to the first end of the first string of series-connected memory cells; and
    wherein the third voltage level applied to the particular access line is configured to inhibit increasing a threshold voltage of a memory cell of the second string of series-connected memory cells coupled to the particular access line while isolating the second data line from the first end of the second string of series-connected memory cells.

15. The electronic system of claim 14, wherein the first voltage level is higher than or equal to 0.5V.

16. The electronic system of claim 15, wherein the first voltage level is lower than or equal to 1V.

17. The electronic system of claim 14, wherein the method that the controller is configured to cause the memory device to perform further comprises applying a voltage level to a first select gate connected in series between the first data line and the first end of the first string of series-connected memory cells that is higher than the first voltage level to connect the first data line to the first end of the first string of series-connected memory cells.

18. The electronic system of claim 14, wherein the method that the controller is configured to cause the memory device to perform further comprises isolating the second end of the first string of series-connected memory cells from the source while applying a voltage level to the source that is lower than or equal to the first voltage level.

19. An electronic system, comprising:
a communications interface;
a memory access device coupled to the communications interface; and
a memory device coupled to the communications interface, the memory device comprising:
  a first data line selectively connected to a first end of a first string of series-connected memory cells;
  a second data line selectively connected to a first end of a second string of series-connected memory cells; and
  a controller, wherein the controller is configured to cause the memory device to perform a method comprising:
    applying a positive first voltage level to the first data line while applying a second voltage level, higher than the first voltage level, to the second data line;
    connecting the first data line to the first end of the first string of series-connected memory cells while applying the first voltage level to the second data line;
    applying a voltage level to a first select gate connected in series between the first data line and the first end of the first string of series-connected memory cells that is higher than the first voltage level to connect the first data line to the first end of the first string of series-connected memory cells;
    isolating the second data line from the first end of the second string of series-connected memory cells while connecting the first data line to the first end of the first string of series-connected memory cells;
    applying a voltage level to a second select gate connected in series between the second data line and the first end of the second string of series-connected memory cells that is lower than or equal to the second voltage level to isolate the second data line from the first end of the second string of series-connected memory cells;
    applying a third voltage level to a particular access line coupled to a memory cell of the first string of series-connected memory cells selected for programming while connecting the first data line to the first end of the first string of series-connected memory cells and while isolating the second data line from the first end of the second string of series-connected memory cells;
    wherein the third voltage level applied to the particular access line is configured to increase a threshold voltage of the memory cell selected for programming, while connecting the first data line to the first end of the first string of series-connected memory cells; and
    wherein the third voltage level applied to the particular access line is configured to inhibit increasing a threshold voltage of a memory cell of the second string of series-connected memory cells coupled to the particular access line while isolating the second data line from the first end of the second string of series-connected memory cells.

20. The electronic system of claim 19, wherein the method that the controller is configured to cause the memory device to perform further comprises applying a voltage level to the second select gate that is lower than or equal to the first voltage level to isolate the second data line from the first end of the second string of series-connected memory cells.

* * * * *

UNITED STATES PATENT AND TRADEMARK OFFICE
CERTIFICATE OF CORRECTION

PATENT NO. : 10,847,233 B2  
APPLICATION NO. : 16/435996  
DATED : November 24, 2020  
INVENTOR(S) : Goda et al.

Page 1 of 1

It is certified that error appears in the above-identified patent and that said Letters Patent is hereby corrected as shown below:

In the Claims

Column 13, Claim 6, Line 61, delete "second stringy" and insert in place thereof --second string--.

Signed and Sealed this  
Fifteenth Day of March, 2022

Drew Hirshfeld  
*Performing the Functions and Duties of the*  
*Under Secretary of Commerce for Intellectual Property and*  
*Director of the United States Patent and Trademark Office*